United States Patent
Panja et al.

(10) Patent No.: US 9,432,015 B2
(45) Date of Patent: Aug. 30, 2016

(54) HYSTERESIS COMPARATOR CIRCUIT HAVING DIFFERENTIAL INPUT TRANSISTORS WITH SWITCHED BULK BIAS VOLTAGES

(71) Applicant: STMicroelectronics International N.V., Amsterdam (NL)

(72) Inventors: Pijush Kanti Panja, West Bengal (IN); Rajesh Yadav, Greater Noida (IN)

(73) Assignee: STMicroelectronics International N.V., Amsterdam (NL)

( * ) Notice: Subject to any disclaimer, the term of this patent is extended or adjusted under 35 U.S.C. 154(b) by 228 days.

(21) Appl. No.: 14/153,119

(22) Filed: Jan. 13, 2014

(65) Prior Publication Data

US 2015/0200632 A1   Jul. 16, 2015

(51) Int. Cl.
| | |
|---|---|
| H03K 5/22 | (2006.01) |
| H03K 17/687 | (2006.01) |
| H03F 3/45 | (2006.01) |
| H03K 5/24 | (2006.01) |
| H03K 3/3565 | (2006.01) |

(52) U.S. Cl.
CPC ........ *H03K 17/687* (2013.01); *H03F 3/45183* (2013.01); *H03F 3/45753* (2013.01); *H03K 5/2481* (2013.01); *H03F 2200/447* (2013.01); *H03F 2203/45341* (2013.01); *H03K 3/3565* (2013.01)

(58) Field of Classification Search
CPC ............... H03F 1/301; H03F 3/45179; H03F 2203/45116; H03F 2200/129; H03K 17/687
USPC .................. 327/50–57, 63, 65–67, 530–543
See application file for complete search history.

(56) References Cited

U.S. PATENT DOCUMENTS

| | | | |
|---|---|---|---|
| 6,064,262 A * | 5/2000 | Wang | H03F 3/45654 330/258 |
| 6,281,753 B1 * | 8/2001 | Corsi | H03F 3/45183 330/258 |
| 6,348,831 B1 * | 2/2002 | Baba | H03K 17/04106 327/408 |
| 7,902,894 B2 | 3/2011 | Mohtashemi | |
| 7,973,569 B1 | 7/2011 | Bashar | |
| 8,552,766 B2 | 10/2013 | Stracquadaini | |

* cited by examiner

*Primary Examiner* — Lincoln Donovan
*Assistant Examiner* — Diana J Cheng
(74) *Attorney, Agent, or Firm* — Gardere Wynne Sewell LLP

(57) ABSTRACT

A first signal received at a first transistor is compared to a second signal received at a second transistor taking into account a hysteresis value to generate a comparison output. At least one of the first and second transistors has a floating bulk. A switching circuit selectively applies first and second bulk bias voltages to the floating bulk of the first or second transistor in dependence on the comparison output. A third and fourth input signals, setting the hysteresis value, are received at third and fourth transistors and compared to generate differential outputs. At least one of the third and fourth transistors has a floating bulk. A differential amplifier determines a difference between the differential outputs for application to the floating bulk of the at least one of the third and fourth transistor and further for use as one of the first and second bulk bias voltages.

13 Claims, 4 Drawing Sheets

HYSTERESIS COMPARATOR CIRCUIT HAVING DIFFERENTIAL INPUT TRANSISTORS WITH SWITCHED BULK BIAS VOLTAGES

TECHNICAL FIELD

This invention relates generally to comparator circuits, and more particularly to a comparator circuit having hysteresis.

BACKGROUND

Reference is made to FIG. 1 which illustrates a circuit diagram for a prior art hysteresis comparator circuit 10 (known to those skilled in the art as an Alstott comparator; Alstott "A precision variable supply CMOS comparator," IEEE Journal of Solid State Circuits, vol. 17, no. 6 (December 1982), the disclosure of which is incorporated by reference). The circuit 10 includes a MOSFET transistor 12 configured to operate as a tail current source for a differential input circuit 14 formed by MOSFET transistors 16 and 18. The transistors 12, 16 and 18 are n-channel devices. The source terminal of transistor 12 is coupled to a ground reference node and the drain terminal of transistor 12 is coupled to a common node 20. The gate terminal of transistor 12 is coupled to receive a bias voltage (BIAS). The source terminals of transistors 16 and 18 are coupled to the common node 20 and the drain terminals of transistors 16 and 18 are coupled to intermediate nodes 22 and 24, respectively. The gate terminal of transistor 16 forms the non-inverting input (INP) of the comparator circuit 10 and the gate terminal of transistor 16 forms the inverting input (INN) of the comparator circuit 10. The output (OUTN or OUTP) of the differential input circuit 14 may be taken at either node 22 or node 24. The outputs OUTP and OUTN are differential analog signals. These analog output signals are converted to a digital output (DATAOUT) by a differential to single-ended converter circuit 40 as known to those skilled in the art.

The load circuit 26 of the differential input circuit 14 is formed by a plurality of p-channel MOSFET devices. A pair of cross-coupled transistors 28 and 30 is coupled between the differential input circuit 14 and a positive supply node (Vdd). The transistor 28 has a source-drain path coupled in series with the source-drain path of the transistor 16. In this configuration, the source terminal of transistor 28 is coupled to the positive supply node and the drain terminal of transistor 28 is coupled to the intermediate node 22 (and drain terminal of transistor 16). The gate terminal of transistor 28 is coupled to the intermediate node 24 (and drain terminal of transistor 18). The transistor 30 has a source-drain path coupled in series with the source-drain path of the transistor 18. In this configuration, the source terminal of transistor 30 is coupled to the positive supply node and the drain terminal of transistor 30 is coupled to the intermediate node 24 (and drain terminal of transistor 18). The gate terminal of transistor 30 is coupled to the intermediate node 22 (and drain terminal of transistor 16). A first diode-connected transistor 32 is coupled in parallel with the transistor 28. Thus, the source terminal of transistor 32 is coupled to the positive supply node and the drain terminal of transistor 32 is coupled both to the gate terminal of transistor 32 and the intermediate node 22. A second diode-connected transistor 34 is coupled in parallel with the transistor 30. Thus, the source terminal of transistor 34 is coupled to the positive supply node and the drain terminal of transistor 34 is coupled both to the gate terminal of transistor 34 and the intermediate node 24.

The transistors 28 and 30 contribute positive feedback providing additional paths for charging the intermediate nodes 22 and 24. This feedback shifts the switching point of the comparator. The size of the transistors 32 and 34 affects the triggering voltage of the comparator. The comparator circuit 10 accordingly operates with a hysteresis value which is determined by the ratio of the $\beta$ for transistors 28 or 30 to the $\beta$ for transistors 32 or 34. However, it in noted that this hysteresis value is vulnerable to process and temperature variation. There is accordingly a need in the art for a comparator circuit having a controllable and stable hysteresis value.

SUMMARY

In an embodiment, a circuit comprises: a comparator configured to compare a first signal received at a first transistor to a second signal received at a second transistor taking into account a hysteresis value to generate a comparison output (wherein at least one of the first and second transistors has a floating bulk); a switching circuit configured to selectively apply first and second bulk bias voltages to the floating bulk of the first or second transistor in dependence on the comparison output; a comparison circuit configured to compare a third and fourth input signals (which set the hysteresis value) received at third and fourth transistors to generate first and second differential outputs (wherein at least one of the third and fourth transistors has a floating bulk); and a differential amplifier configured to determine a difference between the first and second differential outputs for application to the floating bulk of the at least one of the third and fourth transistor and further for use as one of the first and second bulk bias voltages.

In an embodiment, a circuit comprises: a first differential circuit including a first transistor and a second transistor coupled as a first differential input pair, at least one of the first and second transistor having a floating bulk; a third transistor configured as a tail current source coupled to the first differential circuit; and a switching circuit configured to selectively apply a first bulk bias voltage and a second bulk bias voltage to said floating bulk of the at least one of the first and second transistor in dependence on an output of the first differential circuit.

In an embodiment, a method comprises: comparing a first input signal received at a first transistor to a second input signal received at a second transistor taking into account a hysteresis value to generate a comparison output signal, at least one of the first and second transistor having a floating bulk; and selectively applying a first bulk bias voltage and a second bulk bias voltage to said floating bulk of the at least one of the first and second transistor in dependence on the comparison output signal.

In an embodiment, a circuit comprises: a comparator circuit configured to compare a first input signal received at a first transistor to a second input signal received at a second transistor taking into account a hysteresis value to generate a comparison output signal, at least one of the first and second transistor having a floating bulk; and a switching circuit configured to selectively apply a first bulk bias voltage and a second bulk bias voltage to said floating bulk of the at least one of the first and second transistor in dependence on the comparison output signal.

The foregoing has outlined, rather broadly, features of the present disclosure. Additional features of the disclosure will be described, hereinafter, which form the subject of the claims of the invention. It should be appreciated by those skilled in the art that the conception and specific embodiment disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present disclosure, and the advantages thereof, reference is now made to the following descriptions taken in conjunction with the accompanying drawings, in which.

Corresponding numerals and symbols in different figures generally refer to corresponding parts unless otherwise indicated. The figures are drawn to clearly illustrate the relevant aspects of embodiments of the present disclosure and are not necessarily drawn to scale. To more clearly illustrate certain embodiments, a letter indicating variations of the same structure, material, or process step may follow a figure number.

DETAILED DESCRIPTION OF THE DRAWINGS

Figure 2:
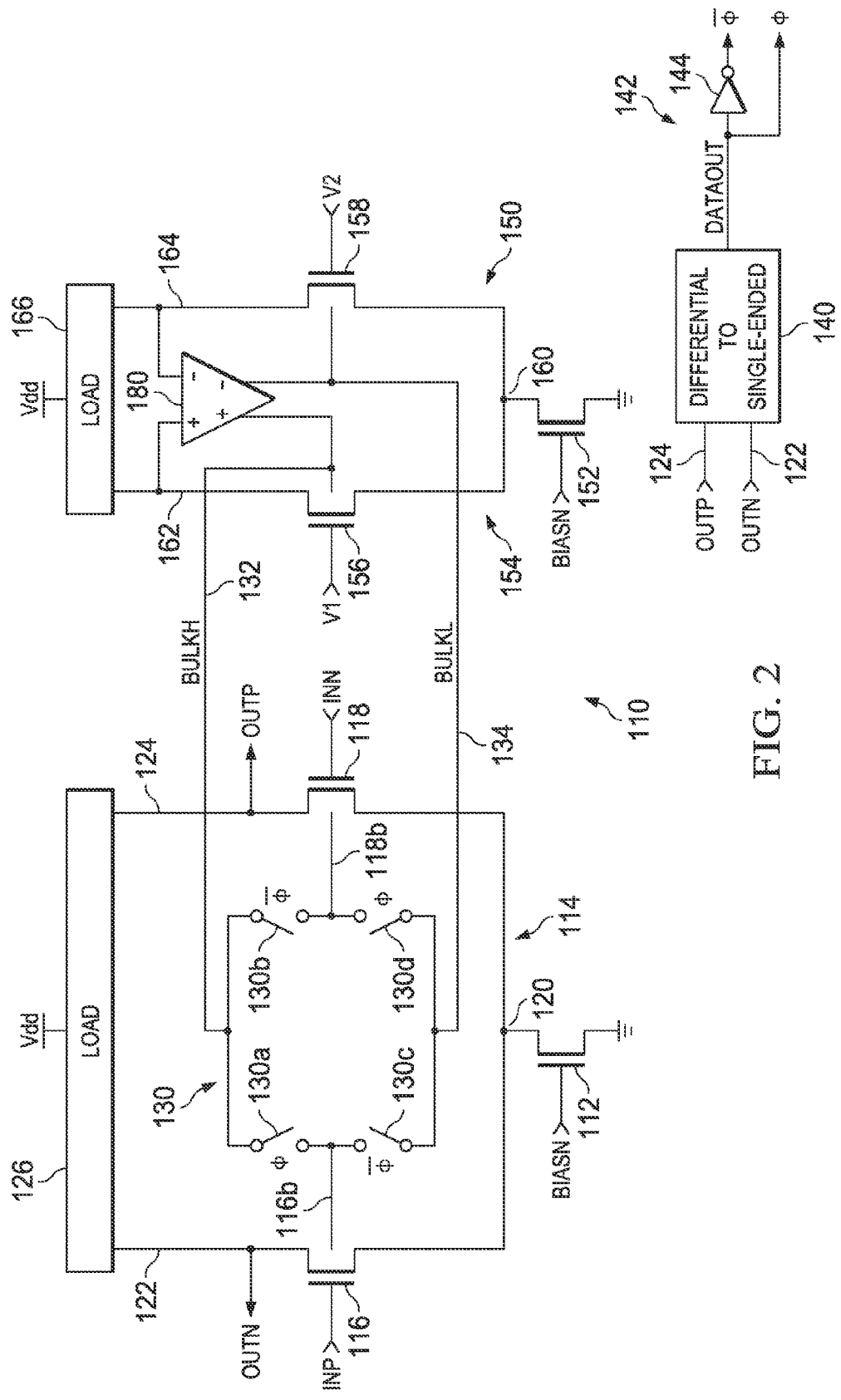
FIG. 2 is a circuit diagram for a hysteresis comparator circuit.

Reference is now made to FIG. 2 which shows a circuit diagram for a hysteresis comparator circuit 110. The circuit 110 includes a MOSFET transistor 112 configured to operate as a tail current source for a differential input circuit 114 formed by MOSFET transistors 116 and 118. The transistors 112, 116 and 118 are n-channel devices. The source terminal of transistor 112 is coupled to a ground reference node and the drain terminal of transistor 112 is coupled to a common node 120. The gate terminal of transistor 112 is coupled to receive a bias voltage (BIASN). The source terminals of transistors 116 and 118 are coupled to the common node 120 and the drain terminals of transistors 116 and 118 are coupled to intermediate nodes 122 and 124, respectively. The gate terminal of transistor 116 forms the non-inverting input (INP) of the comparator circuit 110 and the gate terminal of transistor 118 forms the inverting input (INN) of the comparator circuit 110. The output of the differential input circuit 114, and hence the output of the hysteresis comparator circuit 110 (OUTN and OUTP), may be taken at either node 122 or node 124. The outputs OUTP and OUTN are differential analog signals. These analog output signals are converted to a digital output (DATAOUT) by a differential to single-ended converter circuit 140 as known to those skilled in the art. It will further be understood that the differential input circuit 114 may comprise only a first stage of the comparator circuit, and that additional differential stages may be coupled between outputs OUTP and OUTN and the input of the differential to single-ended converter circuit 140. Additionally, although a differential to single-ended converter circuit 140 is preferred, a single-ended to single-ended converter may be used in some instances.

One or the other or both of the transistors 116 and 118 are configured to have a floating bulk (well) (i.e., the bulk of the transistor is not electrically tied to the source terminal of the transistor, but rather is floating and may be separately contacted and biased). Although conventional MOSFET devices are preferred for the transistors 116 and 118, it will be understood that the transistors 116 and 118 may alternatively be implemented as MOSFET devices have dual gate electrodes with one gate serving as the device gate and another gate corresponding in the description herein to the bulk (well). Such transistors may alternatively comprise any MOSFET device which includes a back-gate configuration, wherein the back-gate corresponds in the description herein to the bulk (well).

Figure 1:
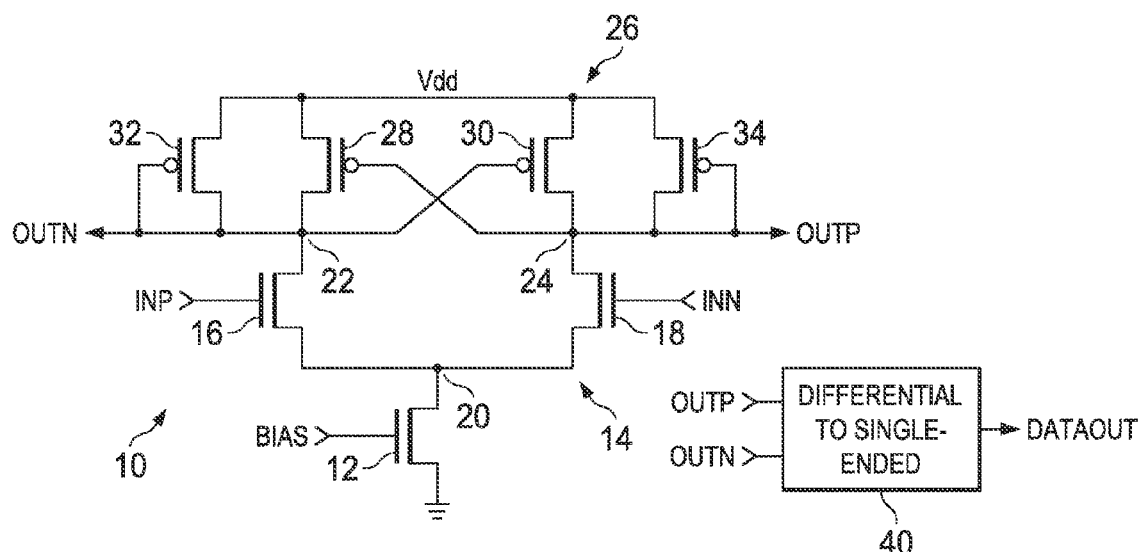
FIG. 1 is a circuit diagram for a hysteresis comparator circuit.

The circuit 110 further includes a load circuit 126 coupled between the positive supply node and the differential input circuit 114. The load circuit 126 may comprise any suitable active or passive load circuit known in the art. For example, the load circuit 126 may comprise a passive resistor circuit formed by a first resistor coupled in series with transistor 116 and a second resistor coupled in series with transistor 124. The load circuit 126 may alternatively comprise a current mirror circuit including a first transistor coupled in series with transistor 116 and a second transistor coupled in series with transistor 118, wherein first and second transistors share a common gate connection and one of the first and second transistors is a diode-connected device. Still further, the load circuit 126 may comprise a circuit like circuit 26 shown in FIG. 1.

A switching circuit 130 is provided to selectively apply analog bias voltages VBH and VBL to the floating bulks (wells) 116b and 118b of the transistors 116 and 118, respectively. The switching circuit 130 includes: a first switch 130a coupled between a BULKH voltage node 132 and the bulk 116b of transistor 116; a second switch 130b coupled between a BULKH voltage node 132 and the bulk 118b of transistor 118; a third switch 130c coupled between a BULKL voltage node 134 and the bulk 116b of transistor 116; and a fourth switch 130d coupled between a BULKL voltage node 134 and the bulk 118b of transistor 118. The first and fourth switches 130a and 130d are commonly controlled by a first control signal φ and the second and third switched 130b and 130c are commonly controlled by a second control signal φ(bar) which is the logical inversion of the first control signal φ. The switches 130a-130d may be implemented as MOSFET devices in a manner well known by those skilled in the art where the gate terminals of the transistors are configured to receive the first control signal φ or the second control signal φ(bar).

When the first control signal φ is logic high (and the second control signal φ(bar) is logic low), the switching circuit 130 functions to couple the VBH analog voltage (from the BULKH voltage node 132) to the bulk 116b of transistor 116 and couple the VBL analog voltage (from the BULKL voltage node 134) to the bulk 118b of transistor 118. The reverse coupling of the analog voltages VBH and VBL occurs when the second control signal φ(bar) is logic high (and the first control signal φ is logic low).

Although both bulks (wells) of transistors 116 and 118 are illustrated as floating to enable selective connection to the BULKH and BULKL voltage nodes, it will be understood that in an embodiment only one of the two transistors 116 and 118 need have the floating connection with the other of the two transistors having a bulk with a fixed connection to the source terminal of the transistor. Both transistors 116 and 118 can having floating bulks since it is not necessary for one of the differential input transistors 116 and 118 to have the bulk tied to the source terminal.

Figure 3:
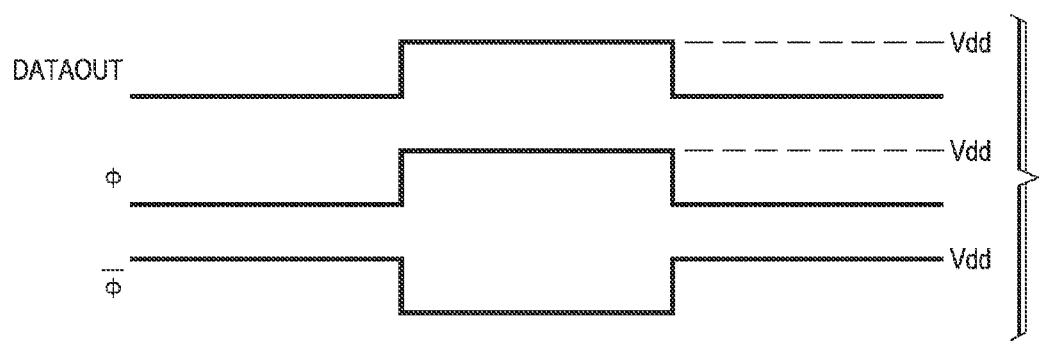
FIG. 3 is a timing diagram for operation of a control signal generator circuit.

The circuit 110 further includes a control signal (CS) generator circuit 142 which receives the digital DATAOUT signal from converter 140 and logically generates the first clock signal φ and the second clock signal φ(bar). In one embodiment, the circuit 142 may comprise a logic NOT gate 144 having an input configured to receive the digital DATAOUT signal and an output configured to generate the second clock signal φ(bar). The first clock signal φ is obtained directly from the digital DATAOUT signal. It will, of course, be understood that the circuit 142 may be a more complex digital logic circuit including, for example, latching and/or non-overlapping data signal generator circuitry. FIG. 3 illustrates a timing diagram for the general relationship between the digital DATAOUT signal and the first clock signal φ and the second clock signal φ(bar).

Reference is once again made to FIG. 2. The circuit 110 further includes a bulk bias generator circuit 150. The circuit 150 includes a MOSFET transistor 152 configured to operate as a tail current source for a differential input circuit 154 formed by MOSFET transistors 156 and 158. The transistors 152, 156 and 158 are n-channel devices. The source terminal of transistor 152 is coupled to a ground reference node and the drain terminal of transistor 152 is coupled to a common node 160. The gate terminal of transistor 152 is coupled to receive the bias voltage (BIASN). The source terminals of transistors 156 and 158 are coupled to the common node 160 and the drain terminals of transistors 156 and 158 are coupled to intermediate nodes 162 and 164, respectively. The gate terminal of transistor 156 forms the non-inverting input of the differential input circuit 154 and the gate terminal of transistor 156 forms the inverting input of the differential input circuit 154. The output of the differential input circuit 154, comprising analog differential output signals, is taken at the nodes 162 and 164.

The circuit 150 further includes a load circuit 166 coupled between the positive supply node and the differential input circuit 154. The load circuit 166 may comprise any suitable active or passive load circuit known in the art. For example, the load circuit 166 may comprise a passive resistor circuit (as described above). The load circuit 166 may alternatively comprise a current mirror circuit (as described above). Still further, the load circuit 166 may comprise a circuit like circuit 26 shown in FIG. 1.

The gate terminals of transistors 156 and 158 are each configured to receive a biasing voltage. More particularly, the gate terminal of transistor 156 receives a first biasing voltage V1 equal to a common mode voltage VCM (of the signals INN and INP) plus an offset voltage, wherein the offset voltage is equal to the desired hysteresis voltage VHYS for the hysteresis comparator circuit 110 divided by two (i.e., VHYS/2). Furthermore, the gate terminal of transistor 158 receives a second biasing voltage V2 equal to the common mode voltage VCM (of the signals INN and INP) minus the offset voltage (VHYS/2). The common mode voltage VCM may equal, for example, Vdd/2 if the signals INN and INP are reference to Vdd and ground. The first and second biasing voltages (V1=VCM+(VHYS/2) and V2=VCM−(VHYS/2)) may be generated by any suitable reference voltage generator circuit known in the art (such as a bandgap reference voltage circuit). It will also be understood that the first and second biasing voltages V1 and V2 may be generated either on-chip or off-chip.

The circuit 150 forms a replica circuit. Thus, thus transistors 152, 156 and 158 along with load 166 correspond to the transistors 112, 116 and 118 along with load 126. In a preferred implementation, the transistors 152, 156 and 158 are sized to be the same (or a replica) with respect to the transistors 112, 116 and 118, respectively.

The circuit 150 further includes a differential amplifier circuit 180. A non-inverting input of the differential amplifier circuit 180 is coupled to the intermediate node 162. An inverting input of the differential amplifier circuit 180 is coupled to the intermediate node 164. The amplifier circuit 180 generates an analog differential output including a positive output which generates the VBH voltage (for the BULKH voltage node) and a negative output which generates the VBL voltage (for the BULKL voltage node). The VBH voltage is also applied to the bulk (well) of transistor 156. The VBL voltage is also applied to the bulk (well) of transistor 158.

Figure 4:
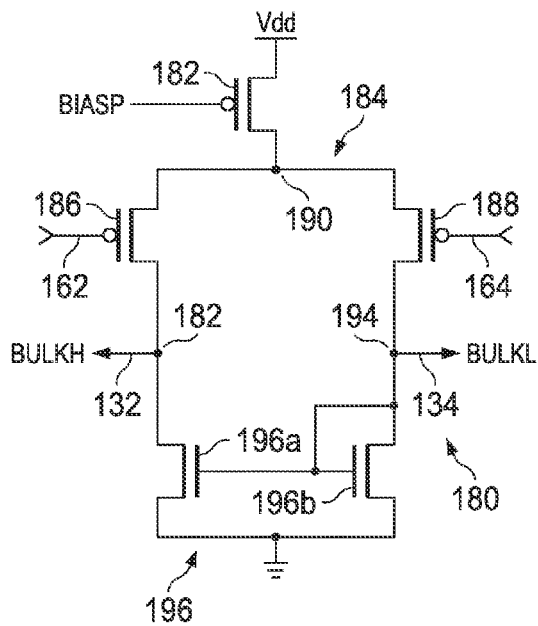
FIG. 4 is a circuit diagram of a differential amplifier circuit.

Reference is now made to FIG. 4 which shows a circuit diagram for the differential amplifier circuit 180. The circuit 180 includes a MOSFET transistor 182 configured to operate as a tail current source for a differential input circuit 184 formed by MOSFET transistors 186 and 188. The transistors 182, 186 and 188 are p-channel devices. The source terminal of transistor 182 is coupled to the positive supply node (Vdd) and the drain terminal of transistor 182 is coupled to a common node 190. The gate terminal of transistor 182 is coupled to receive a bias voltage (BIASP). The source terminals of transistors 186 and 188 are coupled to the common node 180 and the drain terminals of transistors 186 and 188 are coupled to intermediate nodes 192 and 194, respectively. The gate terminal of transistor 186 forms the non-inverting input of the differential input circuit 184 and the gate terminal of transistor 186 forms the inverting input of the differential input circuit 184. A first output of the differential input circuit 184 may be taken at node 192 to provide the VBH voltage for the BULKH voltage node. A second output of the differential input circuit 184 may be taken at node 194 to provide the VBL voltage for the BULKL voltage node. The circuit 180 further includes a load circuit 196 coupled between the ground reference node and the differential input circuit 184. The load circuit 196 comprises a current mirror circuit formed by transistor 196a and transistor 196b. The gate terminals of transistors 196a and 196b are coupled together, and the gate terminal of transistor 196b is coupled to the drain terminal of transistor 196b to configure transistor 196b as a diode-connected device at the input of the current mirror 196. The transistors 196a and 196 have a same size.

Figure 5:
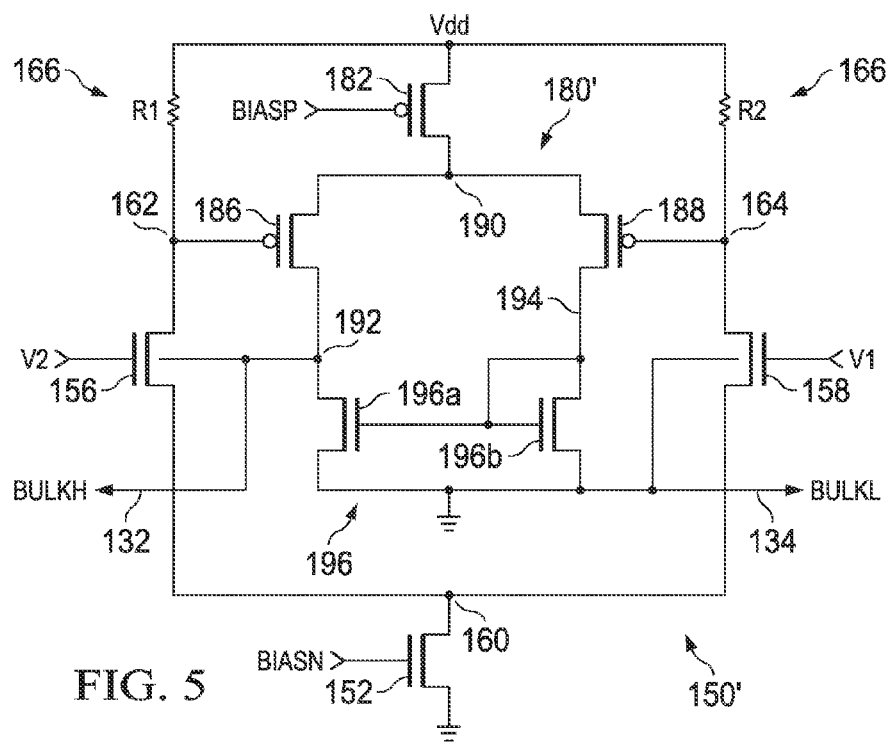
FIG. 5 is a circuit diagram of an embodiment of a bulk bias generator circuit.

Reference is now made to FIG. 5 which shows an alternative embodiment of the bulk bias generator circuit 150'. Like reference numbers refer to like or similar parts. Further description of such parts will not be provided as they have previously been discussed. In this embodiment, the circuits 150' and 180' differ from the circuit 150 of FIG. 2 and the circuit 180 in FIG. 4 in the following ways: a) the load circuit 166 is formed by a first resistor R1 coupled between the positive supply node and the intermediate node 162 and a second resistor R2 coupled between the positive supply node and the intermediate node 164; and b) the VBL voltage for the BULKL voltage node comprises the voltage at the ground reference node. The resistors R1 and R2 have a same resistance value.

Figure 6:
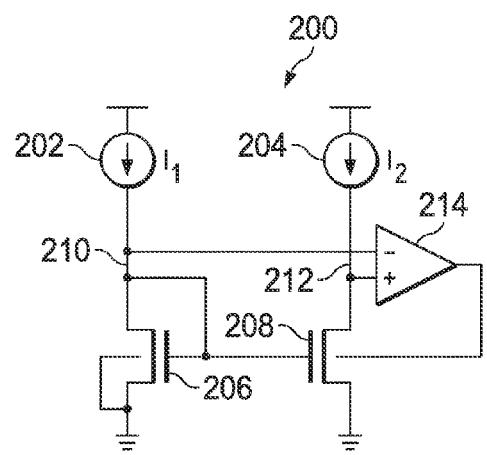
FIG. 6 is a circuit diagram of a bulk control circuit.

The circuit for controlling the bulk (well) exploits the circuit concept shown in FIG. 6. The circuit 200 includes a first current leg carrying a current I1 generated by a first current source 202 and a second current leg carrying a current I2 generated by a second current source 204. The circuit 200 further includes a current mirror circuit formed by transistor 206 and transistor 208. The transistors 206 and 208 in this embodiment are n-channel MOSFET devices. The source terminals of transistors 206 and 208 are coupled to the ground reference node. The transistor 206 is configured as a diode-connected device with its gate terminal coupled to its drain terminal. The source-drain path of transistor 206 is coupled in series with the current source 202 at intermediate node 210. The source-drain path of transistor 208 is coupled in series with current source 204 at intermediate node 212. The first and second currents are not equal (i.e., I1≠I2). In a preferred embodiment, I2 greater than I1, for example, wherein I2=1.2*I1. Thus, there is an increased bulk-to-source voltage (Vbs) in transistor 208 if transistors 206 and 208 have an equal size (i.e., same W/L ratios).

The circuit 200 further includes a differential amplifier 214. The differential amplifier 214 includes an inverting input coupled to the intermediate node 210 and a non-inverting input coupled to the intermediate node 212. The analog output of the differential amplifier is coupled to the bulk (well) of transistor 208. The differential amplifier 214 senses the voltage difference between nodes 210 and 212 and operates in feedback mode to modulate the bulk (well) bias voltage of transistor 208 so as to achieve the higher current I2. The bulk (well) of transistor 206 is coupled to the ground reference node (see, FIG. 5). In an alternative embodiment, the output of the differential amplifier 214 may comprise a differential output with the positive output coupled to the bulk (well) of transistor 208 and the negative output coupled to the bulk (well) of transistor 206 (see, FIGS. 2 and 4). The feedback loop serves to nullify process/temperature spread.

With reference once again to FIG. 2, this nullification of process/temperature spread with respect to the circuit 200 (as implemented through the operation of amplifier 180 acting on the bulks (wells) of transistors 156 and 158) is extended through operation of the switching circuit 130 to the bulks (wells) of transistors 116 and 118 in the comparator circuit.

Figure 7:
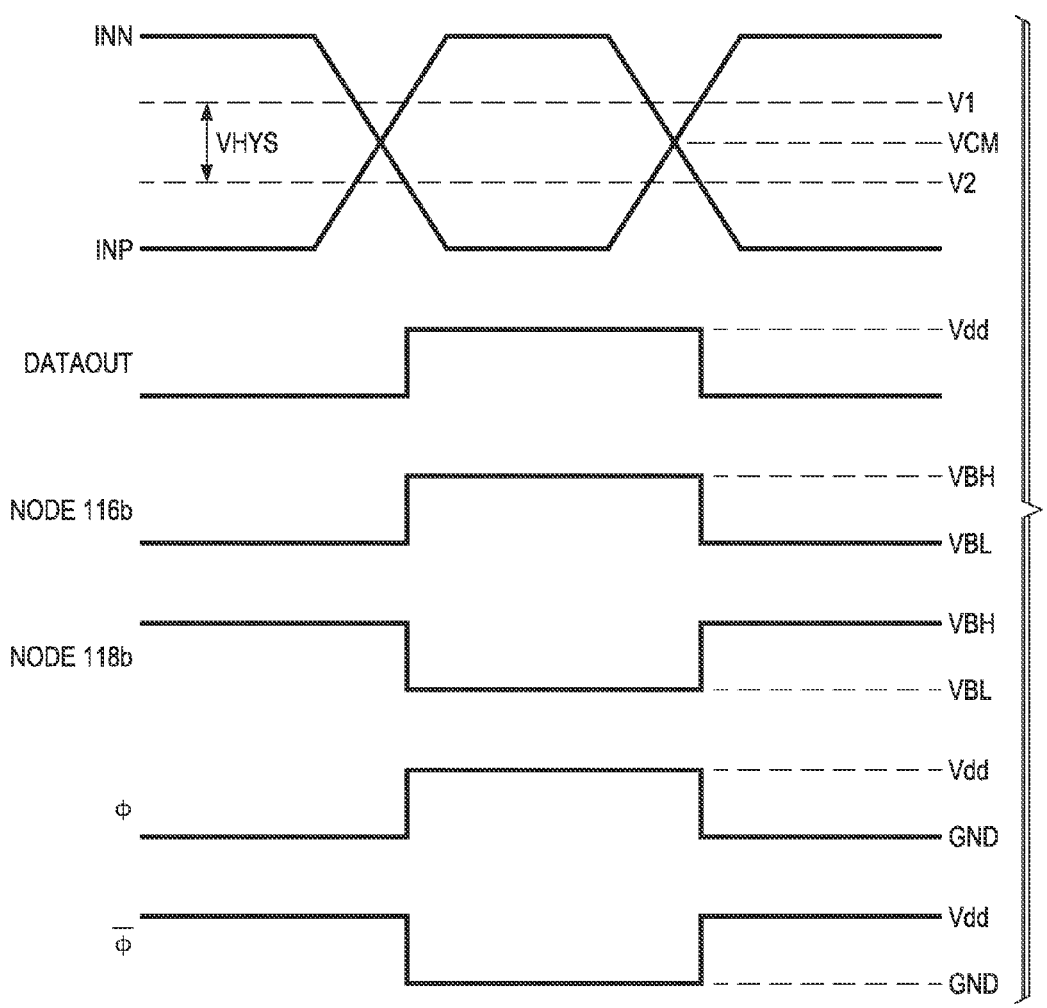
FIG. 7 is a timing diagram for operation of the circuit of FIG. 2.

Reference is now made to FIG. 7 which illustrates a timing diagram for operation of the circuit shown in FIG. 2.

While the drawings illustrate configurations with transistors of certain conductivity type (n-channel and p-channel), it will be understood that the polarity of the circuits could be flipped in a manner well known to those skilled in the art.

It will also be readily understood by those skilled in the art that materials and methods may be varied while remaining within the scope of the present invention. It is also appreciated that the present invention provides many applicable inventive concepts other than the specific contexts used to illustrate embodiments. Accordingly, the appended claims are intended to include within their scope such processes, machines, manufacturing, compositions of matter, means, methods, or steps.

What is claimed is:

1. A circuit, comprising:
a first differential circuit including a first transistor and a second transistor coupled as a first differential input pair, at least one of the first and second transistors having a floating bulk;
a third transistor configured as a tail current source coupled to the first differential input pair;
a switching circuit configured to selectively apply a first bulk bias voltage and a second bulk bias voltage to said floating bulk of the at least one of the first and second transistors in dependence on an output of the first differential circuit; and
a bulk bias voltage generator circuit comprising:
a second differential circuit including a fourth transistor and a fifth transistor coupled as a second differential input pair, at least one of the fourth and fifth transistors having a floating bulk;
a sixth transistor configured as a tail current source coupled to the second differential input pair; and
a differential amplifier circuit having a first input coupled to a first differential output of the second differential circuit and a second input coupled to a second differential output of the second differential circuit and further having an output coupled to floating bulk of the at least one of the fourth and fifth transistors and further coupled to supply at least one of said first and second bulk bias voltages.

2. The circuit of claim 1, wherein a control terminal of the fourth transistor is configured to receive a first bias voltage and a control terminal of the fifth transistor is configured to receive a second bias voltage.

3. The circuit of claim 2, wherein the first and second bias voltages are offset from a common mode voltage.

4. The circuit of claim 3, wherein the first differential circuit is part of a hysteresis comparator, and wherein a hysteresis of the hysteresis comparator is set by the offset.

5. The circuit of claim 4, wherein a control terminal of the first transistor is configured to receive a first input signal and a control terminal of the second transistor is configured to receive a second input signal, said hysteresis comparator configured to compare the first input signal to the second input signal taking into account the hysteresis and generate an output signal indicative of said comparison.

6. The circuit of claim 5, wherein the switching circuit comprises:
a first switch coupled between a source of the first bulk bias voltage and the floating bulk, said first switch controlled by a first control signal; and
a second switch coupled between a source of the second bulk bias voltage and the floating bulk, said second switch controlled by a second control signal which is an inversion of the first control signal.

7. The circuit of claim 6, further comprising a control signal generator circuit configured to generate the first and second control signals in dependence on the output signal indicative of said comparison.

8. A method, comprising:
comparing a first input signal received at a first transistor to a second input signal received at a second transistor taking into account a hysteresis value to generate a comparison output signal, at least one of the first and second transistors having a floating bulk;
selectively applying a first bulk bias voltage and a second bulk bias voltage to said floating bulk of the at least one of the first and second transistors in dependence on the comparison output signal;
comparing a third input signal received at a third transistor to a fourth input signal received at a fourth transistor to generate a first differential output signal and a second differential output signal, at least one of the third and fourth transistors having a floating bulk;
determining a difference between the first and second differential output signals;
applying the determined difference to the floating bulk of the at least one of the third and fourth transistors; and supplying the determined difference as one of the first and second bulk bias voltages.

9. The method of claim 8, wherein the third and fourth input signals are biasing voltages each offset from a common mode voltage.

10. The method of claim 9, wherein the hysteresis value is set by the offset.

11. A circuit, comprising:
a comparator circuit configured to compare a first input signal received at a first transistor to a second input signal received at a second transistor taking into account a hysteresis value to generate a comparison output signal, at least one of the first and second transistors having a floating bulk,
a switching circuit configured to selectively apply a first bulk bias voltage and a second bulk bias voltage to said floating bulk of the at least one of the first and second transistors in dependence on the comparison output signal, wherein said switching circuit comprises:
a first switch coupled between a source of the first bulk bias voltage and the floating bulk, said first switch controlled by a first control signal; and
a second switch coupled between a source of the second bulk bias voltage and the floating bulk, said second switch controlled by a second control signal which is an inversion of the first control signal;
a comparison circuit configured to compare a third input signal received at a third transistor to a fourth input signal received at a fourth transistor to generate a first differential output signal and a second differential output signal, at least one of the third and fourth transistors having a floating bulk; and
a differential amplifier circuit configured to determine a difference between the first and second differential output signals, the differential amplifier circuit having an output configured to apply the determined difference to the floating bulk of the at least one of the third and fourth transistors and supply the determined difference as one of the first and second bulk bias voltages.

12. The circuit of claim 11, wherein the third and fourth input signals are biasing voltages each offset from a common mode voltage.

13. The circuit of claim 12, wherein the hysteresis value is set by the offset.

* * * * *